(12) United States Patent
Tokita et al.

(10) Patent No.: US 6,966,742 B2
(45) Date of Patent: Nov. 22, 2005

(54) WORK ARRANGEMENT APPARATUS

(75) Inventors: Masakuni Tokita, Nagano (JP);
Masatoshi Katayama, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 89 days.

(21) Appl. No.: 10/669,318

(22) Filed: Sep. 25, 2003

(65) Prior Publication Data
US 2004/0105749 A1 Jun. 3, 2004

(30) Foreign Application Priority Data
Oct. 3, 2002 (JP) .............................. 2002-290625

(51) Int. Cl.[7] ............................................. B65G 57/00
(52) U.S. Cl. .................................................. 414/789.5
(58) Field of Search .......................... 414/789.5, 788.4; 270/58.24, 58.31, 58.32

(56) References Cited

U.S. PATENT DOCUMENTS

| | | | | |
|---|---|---|---|---|
| 3,848,757 A | * | 11/1974 | Jordan | 414/802 |
| 4,236,855 A | * | 12/1980 | Wagner et al. | 414/789.5 |
| 5,156,384 A | * | 10/1992 | Donahue | 270/58.31 |
| 5,419,677 A | * | 5/1995 | Cohn | 414/789.5 |
| 6,332,605 B1 | * | 12/2001 | Johansson | 270/58.23 |

FOREIGN PATENT DOCUMENTS

JP 2-86519 3/1990

* cited by examiner

Primary Examiner—Richard Ridley
(74) Attorney, Agent, or Firm—Staas & Halsey LLP (57) ABSTRACT

A work arrangement apparatus arranges plate-shaped works in such a manner that the works are piled up being interposed between interlayer sheets. The apparatus comprises: a work conveyance belt for intermittently transporting the works, one by one; a first air-suction unit for sucking with air the works to the work conveyance belt; an interlayer sheet conveyance belt for intermittently transporting the sheets, one by one, the interlayer sheet conveyance belt being arranged to cross with the work conveyance belt; a second air-suction unit for sucking with air the sheets to the interlayer sheet conveyance belt. The first and second air suction units are controlled in such a manner that the respective sheet is removed from the interlayer sheet conveyance belt to be sucked to the work conveyance belt to be attached to the respective work at a cross position of the work conveyance belt and the interlayer sheet conveyance belt, and both the work and the sheet are removed from the work conveyance belt at a work arrangement position, so that the works are piled up while being interposed between the sheets.

5 Claims, 4 Drawing Sheets

WORK ARRANGEMENT APPARATUS

BACKGROUND OF THE INVENTION

1. Field of the Invention

The present invention relates to a work arrangement apparatus. More particularly, the present invention relates to a work arrangement apparatus for arranging pieces of plate-shaped work, such as lead frames or printed boards, in such a manner that the pieces of plate-shaped work are piled up while being interposed between sheets of interlayer paper.

2. Description of the Related Art

Lead frames, which are formed into slender rectangles, or printed boards, which are formed into individual pieces, are accommodated in accommodation cases being piled up so that they can be conveyed between factories after the completion of a predetermined inspection. When the lead frames or printed boards are piled up and accommodated in the accommodation cases, in order to prevent them from being damaged or deformed, sheets of interlayer paper are interposed, between the lead frames or printed boards, one by one.

The sheets of interlayer paper are formed into the same external shape as that of the lead frames and others. For example, in the case of piling up lead frames, the shapes of which are formed into slender rectangles, sheets of interlayer paper, the shapes of which are formed into the same slender rectangles, are used.

The lead frames or printed boards are piled up by an automated apparatus while the sheets of interlayer paper are interposed between them. Concerning the automated apparatus for piling up the lead frames or printed boards, for example, there is provided an apparatus in which, while lead frames, the shapes of which are formed into slender rectangles, are being sent into an accommodation tray one by one, each time the lead frame is supplied to the accommodation tray, a sheet of interlayer paper is put on the lead frame, so that the lead frames and the sheets of interlayer paper can be alternately piled up. This technique is disclosed, for example, in JP-A-2-86519.

As a method of piling up pieces of work such as lead frames, the shapes of which are formed into slender rectangles, or printed boards, which are formed into individual pieces, while sheets of interlayer paper are being interposed between them, it is common to use the above method in which the sheets of interlayer paper are supplied to a position at which the pieces of work are piled up, and the pieces of work and the sheets of interlayer paper are alternately piled up.

However, the above method in which the pieces of work and the sheets of interlayer paper are respectively sent to the same position and alternately piled up has the following disadvantages. The piling time for one time includes the time necessary for feeding a piece of work and the time necessary for supplying a sheet of interlayer paper. Therefore, even when feeding operation is conducted at high speed, it is technically difficult to conduct piling operation of one time in a short period of time of not more than 1 second.

Further, the following problems may be encountered. In the case of the conventional work arrangement apparatus, in the case where products to be arranged are changed, it is necessary to adjust the apparatus according to the work width. Further, in the case where each piece of work is positioned when it collides with a stopper, the work is damaged.

SUMMARY OF THE INVENTION

The present invention has been accomplished to solve the above problems of the prior art. It is an object of the present invention to provide a work arrangement apparatus characterized in that: pieces of work, which are individually formed into a plate-shape, are very effectively piled up while sheets of interlayer paper are being interposed between them; the work arrangement apparatus can easily cope with a change in the type of the work; there is no possibility that the work is damaged; and work arrangement apparatus can be easily operated.

According to the present invention, there is provided a work arrangement apparatus for arranging plate-shaped works in such a manner that the plate-shaped works are piled up being interposed between interlayer sheets, the apparatus comprising: a work conveyance belt for intermittently transporting the works, one by one; a first air-suction unit for sucking with air the works to the work conveyance belt; an interlayer sheet conveyance belt for intermittently transporting the sheets, one by one, the interlayer sheet conveyance belt being arranged to cross with the work conveyance belt; a second air-suction unit for sucking with air the sheets to the interlayer sheet conveyance belt; controlling unit for controlling the first and second air suction units in such a manner that the respective sheet is removed from the interlayer sheet conveyance belt to be sucked to the work conveyance belt to be attached to the respective work at a cross position of the work conveyance belt and the interlayer sheet conveyance belt, and both the work and the sheet are removed from the work conveyance belt at a work arrangement position, so that the works are piled up being interposed between the sheets.

A horizontal work feeding direction of the work conveyance belt is perpendicular to a horizontal sheet feeding direction of the interlayer sheet conveyance belt.

The work conveyance belt is placed above the sheet conveyance belt and is an endless belt having a lower path and an upper path so that the work is air-sucked to a lower face of the lower path thereof, and the sheet conveyance belt is also an endless belt having a lower path and an upper path so that the sheet is air-sucked to a upper face of the upper path thereof, in such a manner that the respective sheet is removed from the upper path of the interlayer sheet conveyance belt to be sucked to the lower path of the work conveyance belt to be attached to the respective work at the cross position, and both the work and the sheet are removed from the lower path of the work conveyance belt at a work arrangement position, so that the works are piled up being interposed between the sheets.

The first air-suction unit comprises a plurality of air suction boxes continuously arranged along a work feeding direction of the work conveyance belt, and the respective air suction boxes can be individually ON-OFF controlled by the controlling unit, in such a manner that the air suction box placed at the work arrangement position is turned-off to remove both the work and the sheet from the work conveyance belt, so that the works are piled up being interposed between the sheets.

The plurality of air suction boxes are continuously arranged at a first predetermined pitch, and the work conveyance belt intermittently feeds the respective works in the work feeding direction for a distance corresponding to the first predetermined pitch.

The work conveyance belt is provided with a plurality of unit air-suction regions continuously and repeatedly arranged along the work feeding direction at a first predetermined pitch by which the work conveyance belt intermittently transports the works, each of the unit air-suction region comprises at least first and second sub-regions, said first sub-region comprise a plurality of relatively larger apertures for sucking a relatively smaller sized-work and said second sub-region comprise a plurality of relatively smaller apertures for sucking a relatively larger sized-work.

This apparatus further comprises: a detecting unit for detecting whether the respective work is allowable or defective, the detecting unit being placed in a work conveying area by the work conveyance belt; and a defective recovery unit comprising one of the air suction boxes arranged at a recovery position and a defective recovery box, in such a manner that the air suction box placed at the recovery position is turned-off to remove the defective work to be put the defective work into the defective recovery box in accordance with a result of the the detecting unit.

This apparatus further comprises: a cutting unit for cutting an elongated plate-shaped work into a predetermined length of individual plate-shaped works, the unit being placed in front of the work conveyance belt; a gripper for gripping the individual plate-shaped works after having been cut; and a lifter for lifting the plate-shaped work which is brought to a predetermined lifting position by the gripper so that the work is picked up with suction air to the work conveyance belt.

The second air-suction unit comprises a plurality of air suction boxes continuously arranged along a sheet feeding direction of the sheet conveyance belt, and the respective air suction boxes can be individually ON-OFF controlled by the controlling unit, in such a manner that the air suction box placed at the cross position is turned-off to remove the respective sheet from the interlayer sheet conveyance belt to be attached to the respective work.

The plurality of air suction boxes are continuously arranged at a second predetermined pith, and the sheet conveyance belt intermittently feeds the respective sheet in the sheet feeding direction for a distance corresponding to the second predetermined pith.

The plate-shaped work is provided with at least a part thereof through which suction air is leaked, so that the interlayer is sucked to the work conveyance belt and attached to the work sheet by an action of air leaked through the work. The plate-shaped work is a lead frame.

According to another aspect of the present invention, there is provided a work arrangement apparatus for arranging plate-shaped works in such a manner that the plate-shaped works are piled up being interposed between interlayer sheets, the apparatus comprising: a work conveyance belt for intermittently transporting the works, one by one; a first air-suction unit for sucking with air the works to the work conveyance belt; an interlayer sheet conveyance belt for intermittently transporting the sheets, one by one, the interlayer sheet conveyance belt being arranged to cross with said work conveyance belt; a second air-suction unit for sucking with air said sheets to said interlayer sheet conveyance belt; controlling unit for controlling said first and second air suction units in such a manner that said respective work is removed from the work conveyance belt to be sucked to the sheet conveyance belt to be attached to the respective sheet at a cross position of the work conveyance belt and the interlayer sheet conveyance belt, and both the work and the sheet are removed from the sheet conveyance belt at a work arrangement position, so that the works are piled up being interposed between the sheets.

In this connection, the interlayer sheet is provided with at least a part thereof through which suction air is leaked, so that the work can be sucked to the sheet conveyance belt and attached to the sheet by an action of air leaked through the sheet.

DETAILED DESCRIPTION OF THE PREFERRED EMBODIMENTS

Referring to the drawings, a preferred embodiment of the present invention will be explained in detail as follows.

Figure 1:
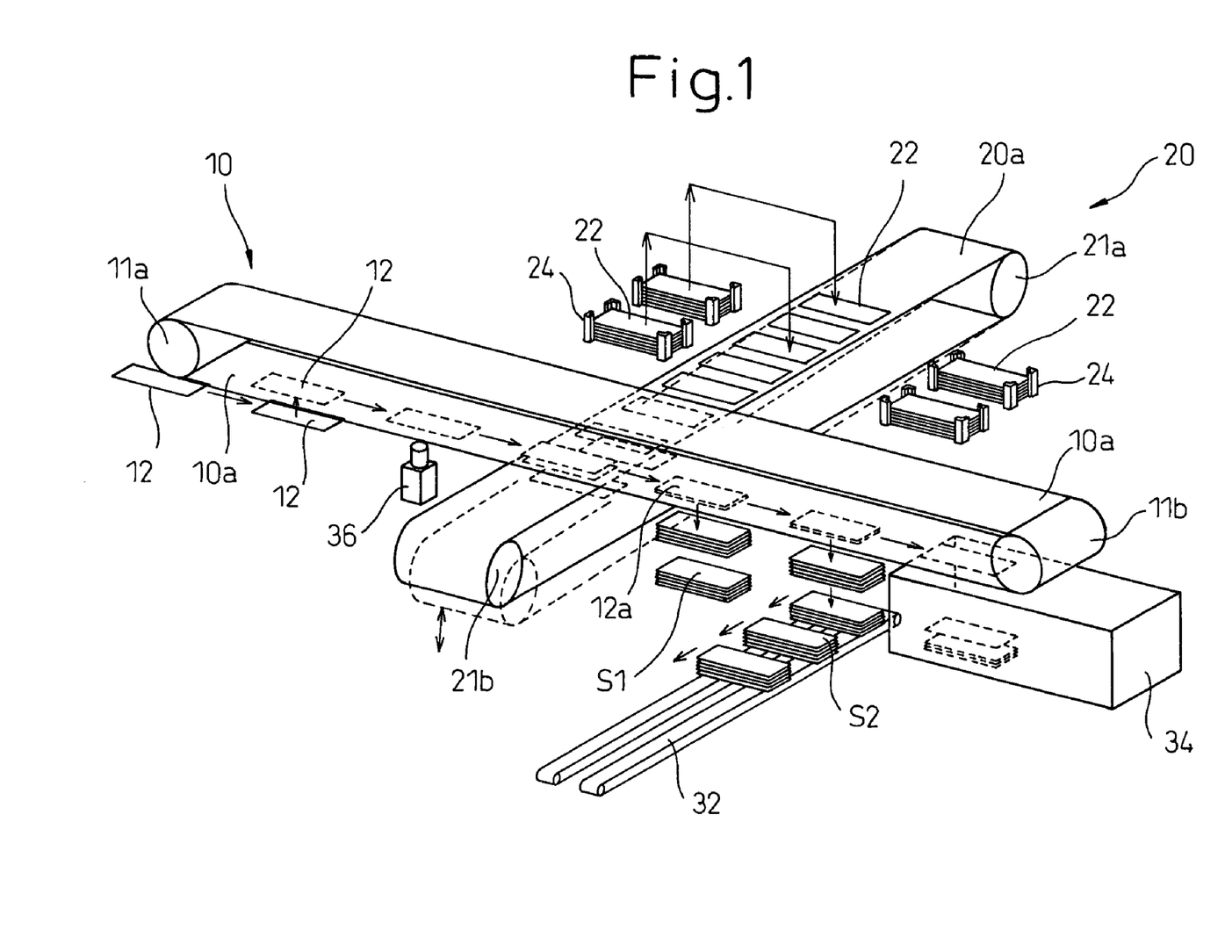
FIG. 1 is a schematic illustration showing an overall arrangement of a work arrangement apparatus of the present invention.

FIG. 1 is a view showing an example of the arrangement apparatus, in which lead frames formed into slender rectangles are arranged, as an embodiment of the work arrangement apparatus of the present invention. In the view, an overall arrangement of the lead frame arrangement apparatus is shown.

Reference numeral 10 is a horizontal, endless work conveyance belt for conveying lead frames 12, which are pieces of work, by sucking the lead frames 12 with air. Reference numeral 20 is a horizontal, endless interlayer paper conveyance belt for conveying the sheet of interlayer paper 22 by sucking them with air. The work conveyance belt 10 and the interlayer paper conveyance belt 20 are arranged in such a manner that the interlayer paper conveyance belt 20 is arranged under the work conveyance belt 10, and the conveyance direction of the work conveyance belt 10 and that of the interlayer paper conveyance belt 20 are perpendicular to each other.

The work conveyance belt 10 is provided being extended between a pair of drive and driven rollers 11a and 11b, which are arranged being separated from each other by a predetermined distance. When the rollers 11a and 11b are driven in one direction by a drive mechanism such a servo motor, the horizontal work conveyance belt 10 is moved being circulated between the rollers 11a and 11b.

After the lead frames 12 have been cut into slender rectangles by a lead frame cutting device arranged in the front stage of the work conveyance belt 10, they are conveyed to the work conveyance belt 10. The work conveyance belt 10 is fed by a predetermined distance in synchronizim with the cutting operation of the lead frame 12 by the cutting device. The belt 10a sucks the lead frame 12, which is sent out from the cutting device, with air and conveys it.

The lower belt path 10a of the work conveyance belt 10 is used for feeding, and the upper belt path is used for returning. The lead frame 12 is sucked to the lower face of the belt 10a for feeding with air. After the lead frame 12 has been conveyed out from the cutting device, it is sucked and supported by the lower belt path 10a of the work conveyance belt 10. Therefore, the lead frame 12 is conveyed by being sucked to the lower belt path 10a.

Concerning the air sucking mechanism for sucking the lead frame 12 to the lower belt path 10a, in this embodiment, air suction holes are formed on the work conveyance belt 10, as mentioned later in detail, and air suction boxes are arranged along the lower belt path 10a so as to suck the lead frame 12 to the belt 10a with air.

Figure 2A:
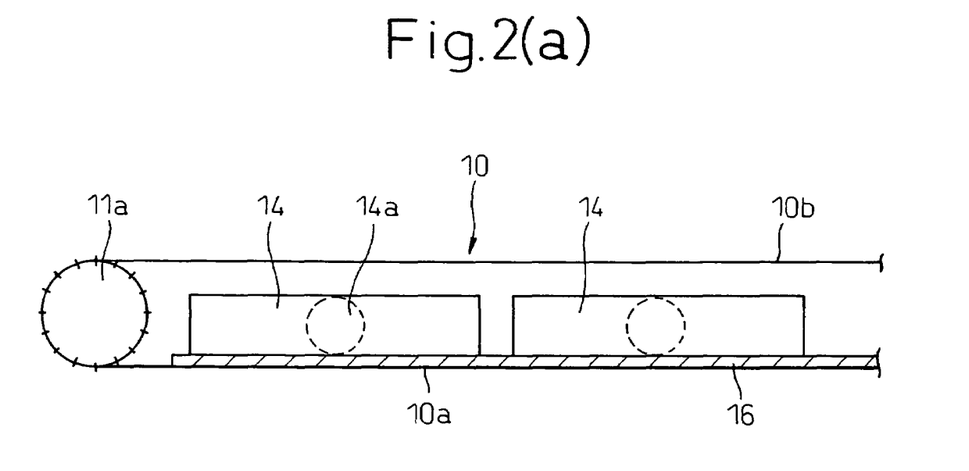
FIG. 2(a) is a schematic illustration showing an arrangement of a work conveyance belt and an air suction box.

FIG. 2(a) is a view showing a state in which a plurality of air suction boxes 14 are arranged on the work conveyance belt 10. Each air suction box 14 is a hollow box, the feeding belt lower path 10a side of which is open. The air suction boxes 14 are continuously arranged in the longitudinal direction of the work conveyance belt 10. The height of the air suction box 14 is formed so that the air suction box 14 can be accommodated in the middle of the lower belt path 10a and the returning, upper belt path 10b. Each air suction box 14 is connected with the air suction duct 14a.

The reason why the air suction boxes 14 are continuously arranged in the longitudinal direction of the work conveyance belt 10 is that the lead frames 12 are moved from one air suction box 14 to the other air suction box 14 for each fixed distance feeding operation of the lead frames 12.

Each lead frame 12 is conveyed while it is being sucked to the lower belt path 10a with air, however, on the rearward side of conveyance of the work conveyance belt 10, suction of the lead frame 12 by the suction box 14 is released, so that the lead frame 12 is removed from the lower belt path 10a. Therefore, it is necessary to conduct controlling the air suction boxes 14 individually so that air suction can be turned on and off. Therefore, when the air suction boxes 14 are arranged at each position of the fixed distance feed operation of the work, it is possible to turn on and off the supply of air at each feeding position.

Of course, in a region in which it is not necessary to detach the lead frame 12 from the lower belt path 10a, the air suction box may be one continuous box. However, even in this case, from the viewpoint of reducing air consumption, it is effective to use the suction boxes which are divided according to each fixed distance feeding operation.

Figure 2B:
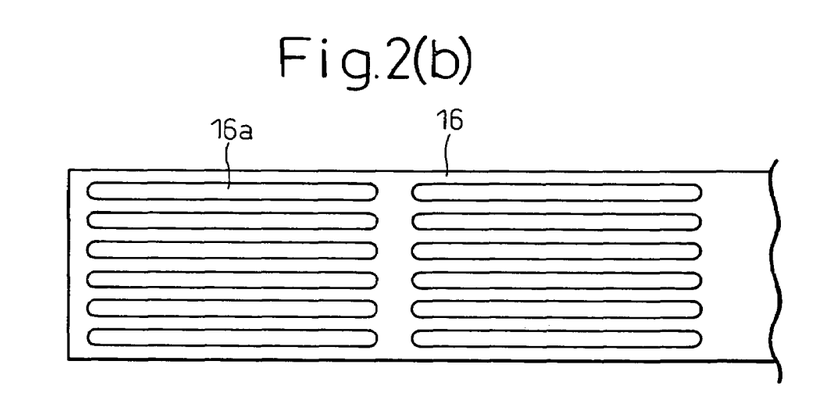
FIG. 2(b) is a plan view of a receiving plate.

In FIGS. 2(a) and 2(b), reference numeral 16 is a receiving plate for supporting and sending the lower belt path 10a in a flat state. On the receiving plate 16, there are provided a large number of slit holes 16a which are open in parallel with the longitudinal direction of the work conveyance belt 10, as shown in FIG. 2(b). The air suction box 14 is communicated with the lower belt path 10a side via these slit holes 16a.

The lower belt path 10a, to which the lead frames 12 are sucked with air, moves on the receiving plate 16 as if it slippes on the surface.

Figure 3:
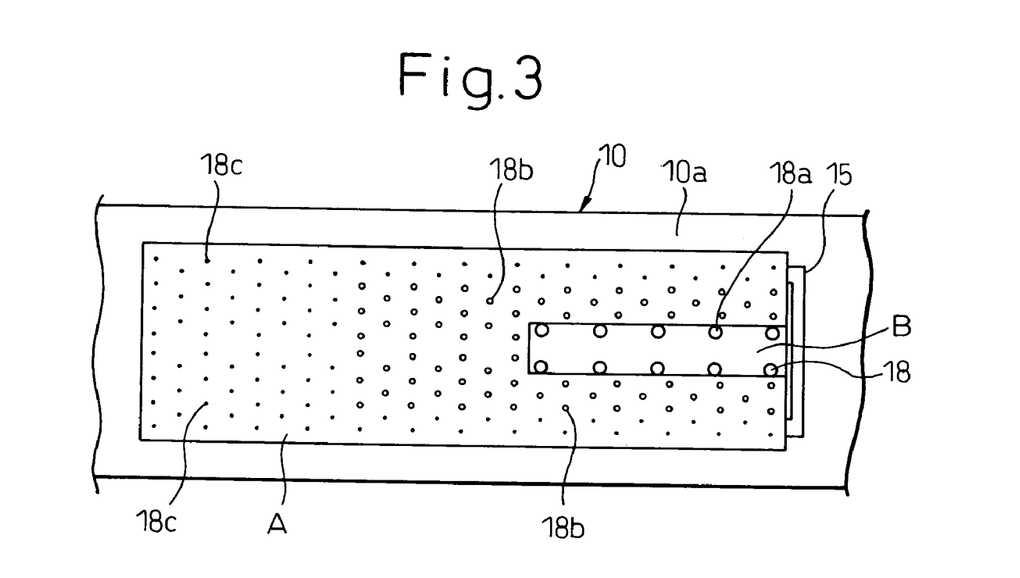
FIG. 3 is a schematic illustration showing an arrangement of suction holes provided on a work conveyance belt.

FIG. 3 is a plan view showing an arrangement of the suction holes 18 formed on the work conveyance belt 10 for sucking the lead frames 12 with air. Suction region A (a range surrounded by a rectangle) of the suction holes 18 shown in FIG. 3 is a unit suction region for sucking one piece of work. On the lower belt path 10a, unit suction regions, in which the suction holes 18 of the same pattern as that of unit suction region A shown in FIG. 3 are formed, are repeatedly provided all over the length of the lower belt path 10a.

Unit suction region A in which the suction holes 18 are formed is provided so that it can correspond to the fixed distance feeding operation by which the work conveyance belt 10 is fed by the fixed distance. That is, the work conveyance belt 10 is intermittently fed by the fixed distance at the arrangement pitch of unit suction region A. Each time of the fixed distance feeding operation, one lead frame 12 is sucked by unit suction region A with air and conveyed.

In this embodiment, unit suction region A, in which the suction holes 18 are formed, is composed so that it can be widely used for sucking the lead frames 12, the sizes and shapes of which are various.

Unit suction region A is a region in which one lead frame 12 is sucked with air. Therefore, the region is ensured so that the largest lead frame 12 can be sufficiently sucked with air.

In the case where a large sized-lead frame 12 is sucked with air, a large number of suction holes are formed in the plane region of the lead frame 12 so that the large sized-lead frame 12 can be positively sucked. Therefore, it is not difficult to design so that the large lead frame 12 can be sucked with air. However, in the case where a small lead frame 12 is sucked with air, if the density of arranging the suction holes is the same as that of the case of the large lead frame 12, the number of the suction holes arranged is too small. Accordingly, it is impossible to obtain a sufficiently strong suction force. Therefore, in the case of the small lead frame 12, it is necessary to provide suction holes, the sizes of which are sufficiently large, to ensure a rate of air flow required for sucking the small lead frame 12.

Region B in FIG. 3 shows a region in which the smallest lead frame 12 in the products to be arranged is sucked with air. In the case of sucking a small sized-lead frame 12, the sizes of the suction holes 18 are set to be larger than the sizes of the other suction holes 18 in unit suction region A so as to ensure a rate of air flow to suck the small lead frame 12.

As the work conveyance belt 10 is fed by a fixed distance at an arrangement pitch of unit suction region A, in this embodiment, the lead frame 12 is sucked with air when a front end portion of unit suction region A is made to be a reference position and this front end position is made to be a reference position of the lead frame 12 so as to suck the lead frame 12 with air. According to the above setting, it is possible to accurately suck the lead frame 12 at a constant position each time the work conveyance belt 10 is fed by a fixed distance. That is, in the case of sucking the small sized-lead frame 12, it is possible to suck the small lead frame 12 with air in region B at all times.

As shown in FIG. 3, unit suction region A includes suction holes 18a, the hole diameters of which are the largest, suction holes 18b, the hole diameters of which are middle size, and suction holes 18c, the hole diameters of which are the smallest. As the hole is separate from the forward end position of unit suction region A, the hole diameter becomes small, and as the hole is separate from the center line position in the width direction of unit suction region A, the hole diameter becomes small. The reason is described below. When the lead frame 12 is large, it is sucked with air by a large number of suction holes 18. Therefore, it is unnecessary to increase the sizes of the suction holes 18. Another reason is described below. As a larger quantity of air is consumed when the sizes of the suction holes 18 are increased, consumption of air in the region, in which the lead frame 12 is not sucked, is suppressed.

In this embodiment, the hole arrangement is designed when the forward end position of unit suction region A is made to be a reference position. In order to ensure that the lead frame 12 is sucked and supported at a predetermined position on the lower belt path 10a, the work conveyance belt 10 is provided with a stopper 15, to which a front end of the work is secured. However, the reference position in the case of sucking the lead frame 12 is not necessarily the forward end position of unit suction region A. The central position of unit suction region A may be made to be the reference position. Alternatively, the rear end position of unit suction region A may be made to be the reference position.

In this connection, concerning the slit holes 16a (FIG. 2(b)), provided on the receiving plate 16 of the belt 10, in order to ensure the suction passage, the suction holes 18 are arranged where the openings of the slit holes 16a are arranged.

As the air suction boxes 14 are continuously arranged in the longitudinal direction of the work conveyance belt 10, the lead frames 12 sucked to the lower belt path 10a with air are successively sucked with air by the adjoining air suction box 14 and conveyed forward. Although a portion in which the air sucking action is shut off is located between the air suction boxes 14 adjacent to each other, as the lead frames 12 are conveyed in the longitudinal direction, between the air suction boxes 14 adjacent to each other, the lead frames 12 are sucked with air by both the air suction boxes 14. Accordingly, there is no possibility that the lead frames 12 drop from the work conveyance belt 10.

In this connection, as an inner lead and outer lead are formed in the lead frame 12, air leaks from a gap portion formed between the leads. However, when a certain quantity of air is used for sucking, it is possible to suck the lead frame with air onto the lower face of the belt 10a.

As shown in FIG. 1, the interlayer sheet or paper conveyance belt path 20 is different from the work conveyance belt 10, and the upper belt path 20a of the interlayer paper conveyance belt 20 is used for feeding. Reference numerals 21a, 21b are a pair of drive and driven rollers for supporting the belt 20 in such a manner that the belt 20 is extended flat in the horizontal direction by the pair of rollers 21a, 21b. These rollers 21a, 21b are driven in one direction by a driving mechanism such as servo motors so that the sheets of interlayer paper 22 can be fed by a fixed distance. On the belt 20, there are provided suction holes for sucking the sheets of interlayer paper 22 to the upper belt path 20a with air. Under the upper belt path 20a, there are provided suction boxes for sucking the sheets of interlayer paper to the upper belt path 20a with air. The constitution of the suction boxes and that of the suction holes formed on the upper belt path 20a are the same as the constitution of the suction boxes 14 and that of the suction holes 18 formed in the work conveyance belt 10 described before. Therefore, the explanations are omitted here.

In this connection, the sheet of interlayer paper 22 is different from the lead frame 12 and has no portion from which air leaks in the process of sucking the sheet of interlayer paper 22. Further, the sheet of interlayer paper 22 is lighter than the lead frame 12. Furthermore, the sheet of interlayer paper 22 is conveyed on the upper belt path 20a. For the above reasons, it is sufficient that the sheet of interlayer paper 22 is sucked without being shifted in the process of conveyance. Therefore, the suction holes may be uniformly provided on the belt 20.

Concerning the suction boxes for sucking the sheets of interlayer paper 22 to the upper belt path 20a, the suction boxes may be arranged so that the sheets of interlayer paper 22, which are located at a plurality of feeding positions, are sucked all together.

As shown in FIG. 1, the sheets of interlayer paper 22 are put on the upper belt path 20a so that the longitudinal direction of the sheets of interlayer paper 22 can be perpendicular to the feeding direction of the interlayer paper conveyance belt 20. The reason is that the direction of the interlayer paper 22 can agree with the direction of the lead frame 12 at the position where the work conveyance belt 10 crosses the interlayer paper conveyance belt 20.

Reference numeral 24 is an accommodation stacker in which the sheets of interlayer paper 22, which are formed into slender rectangles, are accommodated by being put on each other. The accommodation stackers 24 are arranged on both sides of the interlayer paper conveyance belt 20 on the supply side (on the base end side of the interlayer paper conveyance belt 20). When the sheets of interlayer paper 22 are transferred from the plurality of accommodation stackers 24 to the interlayer paper conveyance belt 20, the sheets of interlayer paper 22 can be effectively supplied.

As a method of transferring the sheets of interlayer paper 22 to the interlayer paper conveyance belt 20, it is possible to use a well known method such as a method in which each sheet of interlayer paper 22 is sucked with air by an automated machine having air suction pads and then transferred to the interlayer paper conveyance belt 20.

Next, explanations will be made into an operation in which the lead frames 12 are arranged by the work arrangement apparatus shown in FIG. 1 while the sheets of interlayer paper 22 are being interposed between the lead frames 12.

In the work arrangement apparatus of this embodiment, the lead frames 12 are arranged by being piled up as follows. While the lead frames 12 are being sucked by the work conveyance belt 10, they are fed by a fixed distance. At the position where the work conveyance belt 10 and the interlayer paper conveyance belt 20 cross each other, the sheets of interlayer paper 22 are sucked with air to the lower faces of the lead frames 12. Under the conditions that the lead frames 12 and the sheets of interlayer paper 22 are sucked with air, they are conveyed forward. At the position where the lead frames are to be arranged, the lead frames 12 and the sheets of interlayer paper 22 are removed from the work conveyance belt 10. In this way, the lead frames 12 are arranged by being piled up.

The work conveyance belt 10 and the interlayer paper conveyance belt 20 are set so that the feeding position of the lead frame 12 and that of the interlayer paper 22 agree with each other at the position where both the belts 10 and 20 cross each other. At the time when the sheet of interlayer paper 22 is conveyed to the lower side of the lead frame 12, air suction to suck the sheet of interlayer paper 22 by the interlayer paper conveyance belt 20 is stopped, so that the sheet of interlayer paper 22 is sucked with air to the lower face of the lead frame 12. The sheet of interlayer paper 22 is sucked to the lower face of the lead frame 12 by an air current which leaks from the lead portion of the lead frame 12. Accordingly, in order for the sheet of interlayer paper 22 to be easily sucked to the lower face of the lead frame 12 with air, the conveyance height of the interlayer paper 22 is set close to the conveyance height of the lead frame 12. When the sheet of interlayer paper 22 is sucked with air and attached to the lead frame 12, the leakage of an air current is suppressed. Therefore, the lead frame 12 can be positively sucked to the lower belt path 10a.

In this connection, in the case where operation of feeding the sheets of interlayer paper 22 is affected because the conveyance height of the sheets of interlayer paper 22 is close to the conveyance height of the lead frames 12, it is possible to take the following countermeasures. As shown in FIG. 1, the interlayer paper conveyance belt 20 is composed in such a manner that the forward end side can be moved somewhat upward and downward. When the sheet of interlayer paper 22 is transferred to the cross portion with the lead frame 12 in which both belts cross each other, the forward end side of the interlayer paper conveyance belt 20 is lowered, and the lead frame 12 and the interlayer paper 22 are conveyed being a little separated from each other. When the sheet of interlayer paper 22 is sucked to the lead frame 12 with air, the interlayer paper conveyance belt 20 is raised to the upper position (the initial position), and air suction is stopped and the sheet of interlayer paper 22 is sucked to the lead frame 12. The forward end side of the interlayer paper conveyance belt 20 can be moved upward and downward by a simple driving mechanism such as a cam mechanism or an air cylinder mechanism.

In FIG. 1, reference marks S1 and S2 represent a state in which the lead frames 12 and the sheets of interlayer paper 22 are piled up at the work arrangement position. The work arrangement position is located on the extension of the sucking position at which the sheet of interlayer paper 22 is sucked with air to the lead frame 12 on the work conveyance belt 10. At the point in time when the lead frame 12 and the interlayer paper 22 are conveyed to the work arrangement position, air of the air suction box 14 is shut off. Due to the foregoing, the lead frame 12 and the interlayer paper 22 are removed from the work conveyance belt 10 and piled up. S1 shows a state in which the lead frames 12 and the sheets of interlayer paper 22 are arranged by being simply piled up. S2 shows a state in which a predetermined number of lead frames 12 are piled up and sent out by the conveyor 32. As the lead frames 12 are conveyed by a fixed distance under the condition that the sheets of interlayer paper 22 are sucked with air, the lead frames 12 are appropriately removed from the lower belt path 10a at the position of feeding by a fixed distance, and the lead frames 12 can be arranged being piled up. The position of feeding by a fixed distance can be appropriately selected, and a plurality of arrangement positions may be provided.

Reference numeral 34 is a defect recovery box provided at the most forward end position of the work conveyance belt 10. In the case where a defective lead frame 12 is detected in the work arrangement apparatus, the defective lead frame 12 is conveyed to the defect recovery box 34, in which the defective part can be recovered.

In the case where the defective lead frame 12 is recovered in the work arrangement apparatus, as shown in FIG. 1, the inspection device 36 is provided in the conveyance passage of the lead frame 12, and the lead frames 12 are finally inspected by the inspection device 36. According to the result of inspection, conveyance of the lead frame 12 is controlled, in such a manner that the defective lead frame 12 is maintained to be sucked to the lower belt path 10a at the lead frame arrangement positions S1 and S2 and conveyed to and recovered by the defect recovery box 34. In this way, while the final inspection is being conducted on the lead frames 12, they can be arranged.

In this connection, feeding operation of the work conveyance belt 10, feeding operation of the interlayer paper conveyance belt 20 and ON-OFF operation of air suction of the air suction box 14 are totally controlled by a control section not shown in the drawing.

The control section conducts control as follows. The lead frames 12 are sucked with air to the work conveyance belt 10 while positioning is being accurately conducted. A predetermined number of sheets of interlayer paper 22 are supplied from the accommodation stacker 24 to the interlayer paper conveyance belt 20. The lead frames 12 and the sheets of interlayer paper 22 are accurately positioned at the crossing position where the work conveyance belt 10 and the interlayer paper conveyance belt 20 cross each other. At the work arrangement position, the control section conducts control in which ON-OFF control of air suction of the air suction box 14 is conducted so that the lead frames 12 and the sheets of interlayer paper 22 can be detached from the belt 10a at a predetermined position.

The work arrangement apparatus of this embodiment is characterized in that the operation of feeding the lead frames 12 by a fixed distance and operation of feeding the sheets of interlayer paper 22 by a fixed distance are completely independent from each other. In this embodiment, it is unnecessary to arrange the lead frames 12 after the completion of operation of the sheets of interlayer paper 22. Therefore, the time necessary for the arranging operation is the same as the feeding operation time of the lead frames 12. Therefore, while the sheets of interlayer paper 22 are being interposed between the lead frames 12, the lead frames 12 can be very effectively arranged. According to the conventional work arrangement apparatus, it takes 1.4 to 1.5 second for arranging pieces of work. However, according to the work arrangement apparatus of this embodiment, the work arrangement time can be reduced to only 0.4 second.

According to the work arrangement apparatus of this embodiment, the following advantages can be provided. Even when the size and the profile of the lead frame 12 are changed, it is unnecessary to change the apparatus constitution. Therefore, the work arrangement apparatus of this embodiment can be widely applied to the manufacture of various types of products. Recently, there has been a tendency that the products are diversified. Accordingly, the work arrangement apparatus capable of being widely used is effective in practical use.

As the lead frames 12 are supported by being sucked to the belt 10a, when the lead frames 12 are positioned in the case of sucking the lead frames 12 to the belt 10a, it becomes unnecessary to conduct positioning at the fixed distance feeding position. Accordingly, there is no possibility that the lead frames 12 collide with a stopper and are damaged.

In the case of piling up the lead frames 12, the lead frames 12 are removed from the work conveyance belt 10. At this time, when a dropping distance of each lead frame 12 is short, damage of the lead frame 12 can be prevented.

Figure 4:
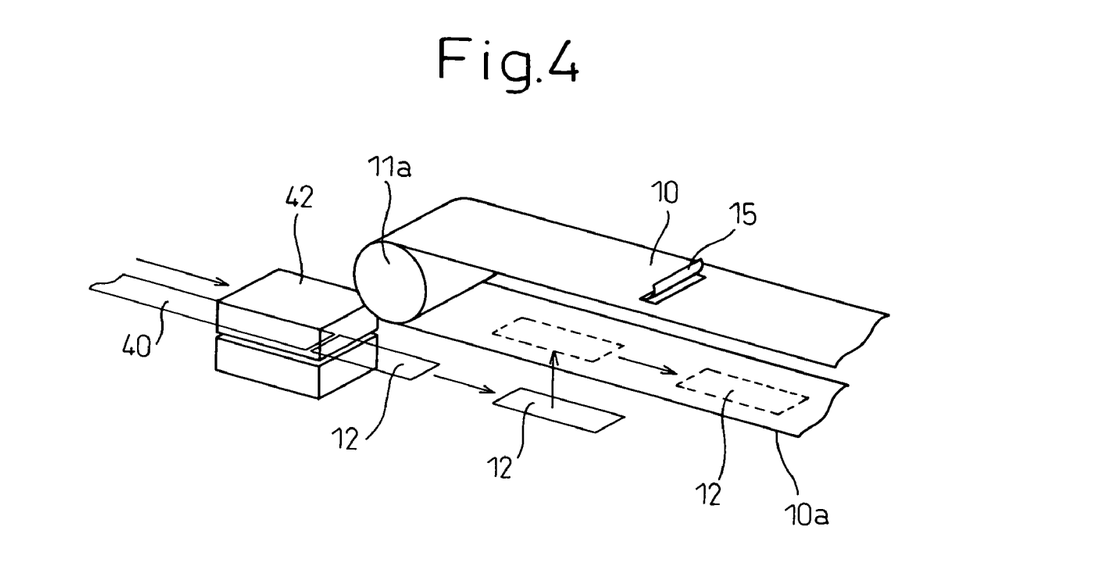
FIG. 4 is a schematic illustration showing an arrangement of a work conveyance belt and a lead frame cutting device.
Figure 5:
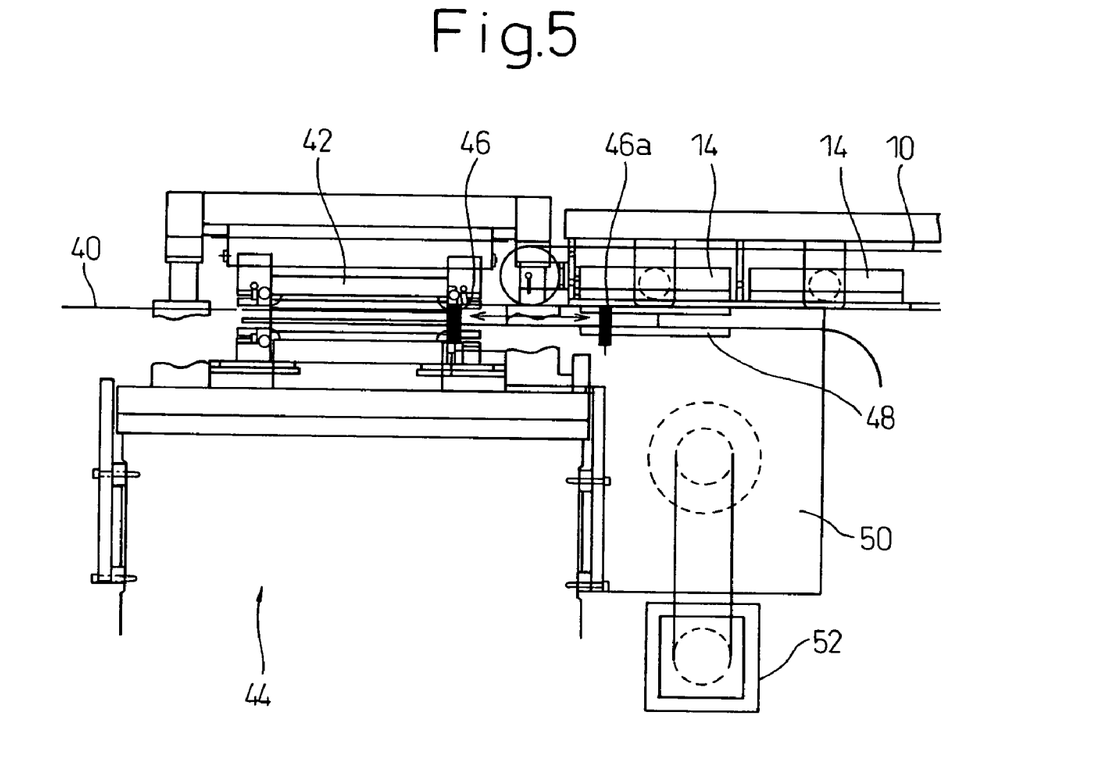
FIG. 5 is a schematic illustration showing the constitution of the lead frame cutting device.

FIGS. 4 and 5 are views showing a cutting device, particularly showing the front side of the work conveyance belt 10. This cutting device supplies lead frames, which are cut into individual slender rectangles, to the work conveyance belt 10. As shown in FIG. 4, the lead frame cutting device cuts the long lead frame 40 into slender rectangular pieces with the cutting metallic die 42. The slender rectangular individual lead frames 12 are drawn out to the lower side of the work conveyance belt 10 and sucked to the belt 10a and sent forward.

In FIG. 5, reference numeral 44 is a punching device used for cutting, reference numeral 42 is a metallic die used for cutting which is driven by the punching device 44, reference numeral 46 is a gripper for clamping an end portion of the lead frame 12 and drawing the lead frame 12 to the air sucking position, and reference numeral 48 is a lifter for lifting the lead frame 12, which has been cut into an individual piece, to the air sucking position of the work conveyance belt 10. Reference numeral 50 is an operation unit for operating the gripper 46 and the lifter 48, and reference numeral 52 is a drive motor for driving the operation unit 50.

The long lead frame 40 is fed into the metallic die 42 used for cutting and cut into a predetermined length. When the lead frame 40 is cut with the metallic die 42 used for cutting, a burr is generated and the lead frame 12 might stick to the metallic die 42 used for cutting. However, when the lead frame 12 is clamped by the gripper 46 and drawn out, the lead frame 12 can be positively delivered to the work conveyance belt 10. When the lead frame 12 is drawn out by the gripper 46, it is possible to draw out the lead frame 12 at high speed. Further, it is possible to accurately position the lead frame 12 and suck the lead frame 12 to the work conveyance belt 10 with air.

In this embodiment, when the lead frame 12 is drawn out by the gripper 46 (Reference numeral 46a represents a position at which the gripper 46 has been drawn out.), the lead frame 12 is delivered to the lifter 48, and the lifter 48 pushes up the lead frame 12 so that the lead frame 12 is sucked to the work conveyance belt 10 with air.

As described above, the long lead frame 40 is cut into slender rectangles by the metallic die 42 used for cutting, and the lead frame 12 is drawn out by the gripper 46, so that the lead frame 12 can be positively delivered to the work conveyance belt 10. Therefore, the lead frame 12 can be positively cut out at high speed and conveyed to the work arrangement apparatus. Accordingly, the work arrangement can be effectively conducted.

In the above embodiment, explanations are made into the method of arranging the lead frames 12. However, the work arrangement apparatus of the present invention is not limited to the use of arranging the lead frames. The work arrangement apparatus of the present invention can be preferably used for arranging plate-shaped things such as printed boards or the like. However, the sheets of interlayer paper 22 are sucked to the lower faces of the pieces of work while the pieces of work are being sucked to the work conveyance belt 10 with air. Therefore, the work must be a product having the characteristic in which air leaks partially through the work while the work is being sucked to the belt 10a so that the interlayer paper 22 can be sucked to the work by the action of this leakage of air.

According to the work arrangement apparatus of the present invention, pieces of plate-shaped work such as lead frames or printed boards can be piled up at high speed while sheets of interlayer paper are being interposed between the pieces of plate-shaped work. Therefore, the working efficiency of arranging lead frames or the like can be effectively enhanced.

It should be understood by those skilled in the art that the foregoing description relates to only some preferred embodiments of the disclosed invention, and that various changes and modifications may be made to the invention, without departing the sprit and scope thereof, described in the attached claims.

What is claimed is:

1. A work arrangement apparatus for arranging plate-shaped works in such a manner that the plate-shaped works are piled up being interposed between interlayer sheets, said apparatus comprising:

a work conveyance belt for intermittently transporting said works, one by one;

a first air-suction unit for sucking with air said works to said work conveyance belt;

an interlayer sheet conveyance belt for intermittently transporting said sheets, one by one, said interlayer sheet conveyance belt being arranged to cross with said work conveyance belt;

a second air-suction unit for sucking with air said sheets to said interlayer sheet conveyance belt;

controlling unit for controlling said first and second air suction units in such a manner that said respective sheet is removed from said interlayer sheet conveyance belt to be sucked to said work conveyance belt to be attached to said respective work at a cross position of said work conveyance belt and said interlayer sheet conveyance belt, and both said work and said sheet are removed from said work conveyance belt at a work arrangement position, so that said works are piled up being interposed between said sheets.

2. An apparatus as set for claim 1, wherein a horizontal work feeding direction of said work conveyance belt is perpendicular to a horizontal sheet feeding direction of said interlayer sheet conveyance belt.

3. An apparatus as set for claim 2, wherein said work conveyance belt is placed above said sheet conveyance belt and is an endless belt having a lower path and an upper path so that said work is air-sucked to a lower face of the lower path thereof, and said sheet conveyance belt is also an endless belt having a lower path and an upper path so that said sheet is air-sucked to an upper face of the upper path thereof, in such a manner that said respective sheet is removed from said upper path of the interlayer sheet conveyance belt to be sucked to said lower path of the work conveyance belt to be attached to said respective work at said cross position, and both said work and said sheet are removed from said lower path of the work conveyance belt at a work arrangement position, so that said works are piled up being interposed between said sheets.

4. An apparatus as set for claim 1, wherein said plate-shaped work is provided with at least a part thereof through which suction air is leaked, so that said interlayer is sucked to said work conveyance belt and attached to said work sheet by an action of air leaked through said work.

5. An apparatus as set for claim 1, wherein said plate-shaped work is a lead frame.

\* \* \* \* \*

UNITED STATES PATENT AND TRADEMARK OFFICE
CERTIFICATE OF CORRECTION

| | |
|---|---|
| PATENT NO. | : 6,966,742 B2 |
| APPLICATION NO. | : 10/669318 |
| DATED | : November 22, 2005 |
| INVENTOR(S) | : Masakuni Tokita et al. |

It is certified that error appears in the above-identified patent and that said Letters Patent is hereby corrected as shown below:

Column 3, line 17, delete "the" second occurrence

Column 3, line 36, change "pith to --pitch--.

Column 3, line 39, change "pith to --pitch--.

Column 4, line 51-52, change "synchronizim" to --synchronism--.

Signed and Sealed this

Twenty-fifth Day of July, 2006

JON W. DUDAS
*Director of the United States Patent and Trademark Office*